United States Patent [19]
Sato

[11] Patent Number: 5,079,746
[45] Date of Patent: Jan. 7, 1992

[54] SEMICONDUCTOR MEMORY CIRCUIT

[75] Inventor: Noriaki Sato, Machida, Japan

[73] Assignee: Fujitsu Limited, Kawasaki, Japan

[21] Appl. No.: 306,961

[22] Filed: Feb. 7, 1989

[30] Foreign Application Priority Data

Feb. 8, 1988 [JP] Japan .................................. 63-27220

[51] Int. Cl.$^5$ ........................ G11C 17/14; H01L 27/10
[52] U.S. Cl. ................................. 365/225.7; 365/149; 365/181
[58] Field of Search ................. 365/149, 182, 184, 94, 365/96, 104, 174, 225.7, 181, 189.01

[56] References Cited

U.S. PATENT DOCUMENTS 4,782,466 11/1988 Yamaguchi ......................... 365/149

FOREIGN PATENT DOCUMENTS 56-91464 7/1981 Japan .

OTHER PUBLICATIONS

N. Sato et al., "A New Programmable Cell Utilizing Insulator Breakdown", Tech. Dig. of IEDM' 85, pp. 639-642.

Primary Examiner—Joseph A. Popek
Attorney, Agent, or Firm—Armstrong, Nikaido, Marmelstein, Kubovcik & Murray

[57] ABSTRACT

A semiconductor memory circuit comprises a plurality of memory cells and a plurality of programming transistors, each memory cell being provided at the intersections of one bit line and one word line. The memory cell includes an insulator and a cell transistor, and a conductivity type of the cell transistor selected by a word line select signal is opposite to that of the programming transistor selected by a bit line select signal. The memory cell is programmed by utilizing an electrical breakdown of the insulator, when the bit line select signal and the word line select signal supplied are in-phase and both the programming transistor and the cell transistor are switched. Therefore, the memory cell is programmed in a short time during which the programming transistor and the cell transistor are switched, and thus this semiconductor memory circuit can be programmed with a low consumption of power and of a high speed.

10 Claims, 6 Drawing Sheets

SEMICONDUCTOR MEMORY CIRCUIT

BACKGROUND OF THE INVENTION

1. Field of the Invention

The present invention relates to a semiconductor memory circuit, more particularly, to a semiconductor memory circuit having PROM cells utilizing an electrical breakdown of each insulator thereof for programming.

2. Description of the Related Art

Conventionally, three types of programmable cells are provided for One-Time-PROMs, i.e., a fuse type cell, a junction-shorting type cell, and an EPROM cell. Recently, however, a new programmable cell known as a Breakdown of Insulator for Conduction cell (BIC cell) has been developed.

This BIC cell utilized an electrical breakdown of an insulator for programming, and has an advantage in that it can be programmed within 1 $\mu$sec. Therefore, if a PROM cell is composed of a BIC cell and a MIS transistor, it becomes possible to realize a high speed programming operation. However, problems have arisen in the prior semiconductor memory circuit using the BIC cell and the MIS transistor in that in this prior semiconductor memory circuit, since an insulator of the BIC cell is broken after a high potential application, a large amount of power is unnecessarily consumed because a large current continues to flow after the program process is completed.

SUMMARY OF THE INVENTION

An object of the present invention is to provide a semiconductor memory circuit having PROM cells which can be programmed with a low consumption of power and by a high speed operation.

According to the present invention, there is provided a semiconductor memory circuit which comprises a plurality of work lines, a plurality of bit lines, a plurality of memory cells, and a plurality of programming transistors. Each word line receives a word line select signal, and each memory cell comprises an insulator and a cell transistor of a first conductivity type and is provided at the intersection between the one bit line and the one word line. The memory cell is programmed by utilizing an electrical breakdown of the insulator, and the cell transistor includes a drain connected to the bit line through the insulator, a gate connected to the word line, and a source connected to a first power supply. Each programming transistor, which is formed by a second conductivity type opposite to the first conductivity type, includes a drain connected to each bit line, a gate supplied with a bit line select signal, and a source connected to a second power supply. The bit line select signal and the word line select signal include pulse signals having an in-phase at the time of programming.

As described above, the semiconductor memory circuit comprises a plurality of memory cells and a plurality of programming transistors, each memory cell being provided at the intersections between one bit line and one word line. The memory cell includes an insulator and a cell transistor, and a conductivity type of the cell transistor selected by a word line select signal is opposite to that of the programming transistor selected by a bit line select signal. The memory cell is programmed by utilizing an electrical breakdown of the insulator, when the bit line select signal and the word line select signal are applied in the in-phase state and both the programming transistor and the cell transistor are switched. Therefore, the memory cell is programmed in a short time during which both the programming transistor and the cell transistor are switched, and thus this semiconductor memory circuit can be programmed with a low consumption of power and by a high speed operation.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments, the problems of the prior art will be first explained.

Figure 1:
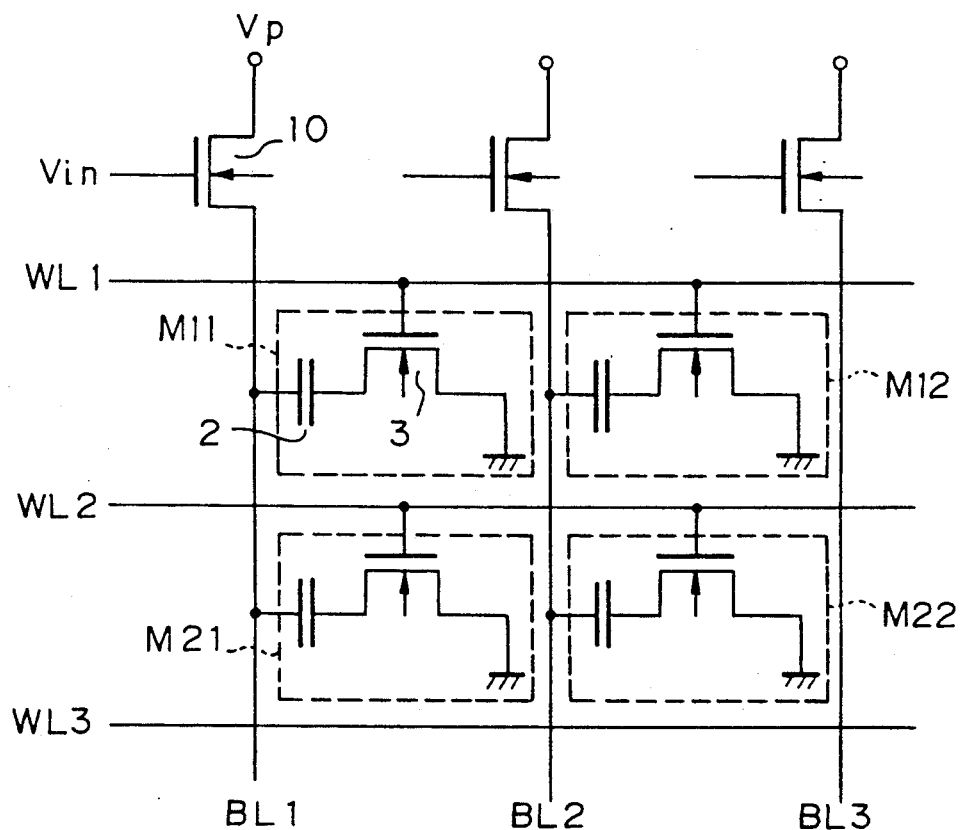
FIG. 1 is a circuit diagram showing an example of a prior array.

FIG. 1 is a circuit diagram showing an example of a prior PROM cell array. In FIG. 1, reference numeral 10 denotes a programming transistor, which is an N-channel type MIS transistor, 2 denotes a thin film insulator, 3 denotes a cell transistor, which is an N-channel type MIS transistor, reference BL1–BL3 denote bit lines, WL1–WL3 denote word lines, and M11–M22 denote memory cells of the PROM cell array.

Each memory cell M11–M22 is provided at an intersection between bit lines BL1, BL2 and word lines WL1, WL2, and comprises an insulator 2 and cell transistor 3. For example, in the memory cell M11, a gate of the cell transistor 3 is connected to the word line WL1, a source of the cell transistor 3 is connected to an earth, and a drain of the cell transistor 3 is connected to the bit line BL1 through the insulator 2. Further, the bit line BL1 is connected to a source of a programming transistor 10, which is an N-channel type MIS transistor, a gate of the transistor 10 is supplied with a bit line selecting signal Vin, and a drain of the transistor 10 is supplied with a programming power supply potential Vp, which is an extremely high potential, e.g., 18 volts, for programming the PROM cell. Note, the word line WL1 is supplied with a word line selecting signal.

Below, an example of programming a memory cell M11 is explained. First, a bit line select signal Vin supplied to the gate of the programming transistor 10 is brought to a high level, e.g., 5 volts, and then the programming transistor 10 is switched ON and a programming power supply potential Vp, which is an extremely high potential, is applied to a bit line BL1. Namely, the high potential of the bit line BL1 is applied to one side of the insulator 2. Next, a word line select signal WL1 supplied to a gate of the cell transistor 3 is brought to a high level, e.g., 5 volts, and the cell transistor 3 is switched ON, so that an insulation of the insulator 2 is electrically broken and a programming operation is carried out. Note, the potential of the bit line BL1, which is determined by a programming power supply potential Vp, is higher than an electrical breakdown voltage of the insulator 2. The programming power supply potential Vp is, for example, 18 volts, as described above.

In the above semiconductor memory circuit, since the insulator 2 is broken after the application of a high potential, problems arise in that a large amount of power is unnecessarily consumed because a large current, e.g., 1 milliampere, continues to flow after a programming operation is completed. Furthermore, this unnecessary consumption of a large amount of power causes a heating of signal conductors of bit lines or memory cells, and enlarges a capacity of the signal conductors to avoid a breaking of the signal conductors, and thus the operating life of the transistor is shortened and it is difficult to realize a high integration.

In consideration of the above-mentioned problems, an object of the present invention is to provide a PROM cell which can be programmed with a low consumption of power.

Next, a Breakdown of Insulator for Conduction cell (BIC cell) will be explained with reference to FIGS. 2 and 3.

Figure 2:
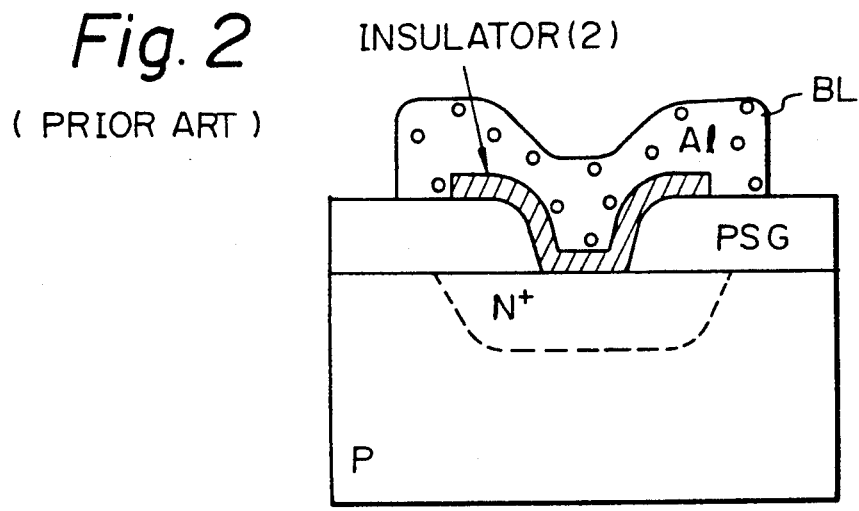
FIG. 2 is a cross sectional view of a BIC cell.

FIG. 2 is a cross sectional view of a BIC cell. As shown in FIG. 2, the BIC cell comprises a thin insulator layer 2 which covers a contact area on an $N^+$-diffusion layer provided in a P-substrate, and an Al (aluminum) electrode connected to a surface of the insulator 2. Namely, the insulator 2 is formed between a signal conductor of the bit line BL and a contact area of the $N^+$-diffusion layer, which corresponds to a drain of a cell transistor. In the programming state, the Al electrode of the bit line BL is isolated from the $N^+$-diffusion layer, and a pulse is supplied to the Al electrode during a programming of the BIC cell, the insulator 2 breaks down and a connection is formed between the Al electrode and the $N^+$-diffusion layer. Note, a BIC cell can be formed on a contact area of the $N^+$-diffusion layer in the cell transistor, as it has a stacked-cell structure. In this BIC cell, a preprogrammed cell exhibits a very high resistance, e.g., more than $1 \times 10^{13}$ ohms, but the resistance of the programmed cell is very low, e.g., $1 \times 10^2$ ohms, and therefore, a read-out delay due to the cell resistance is negligibly short. Furthermore, in practice, BIC cells are not subject to failure even after a large number of read operations, e.g., $1 \times 10^5$ read operations, and therefore, the readout operations of the BIC cells are very reliable.

Figure 3A:
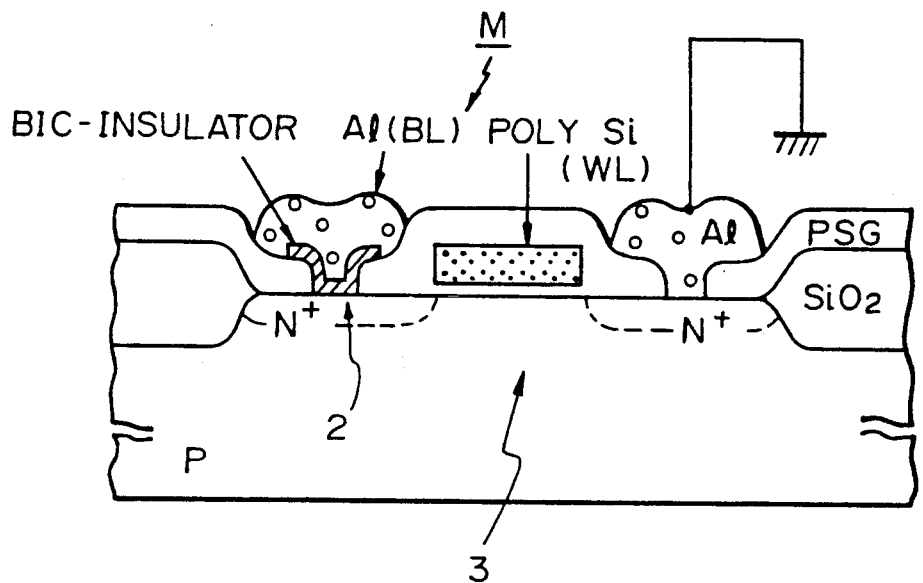
FIG. 3A is a cross sectional view of a PROM cell.
Figure 3B:
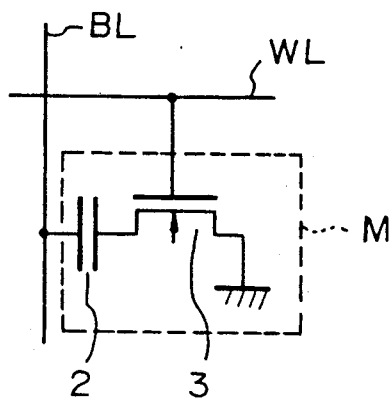
FIG. 3B is an equivalent circuit diagram of the PROM cell shown in FIG. 3A.

FIG. 3A is a cross sectional view of a PROM cell, and FIG. 3B is an equivalent circuit diagram of the PROM cell shown in FIG. 3A. As shown in FIG. 3A, a PROM cell can be formed by connecting the insulator 2 of the BIC cell to a MOS transistor which corresponds to the cell transistor 3, with the $N^+$-diffusion layer of the BIC cell acting as a drain of the MOS transistor 3. This PROM cell has an advantage in that it can be provided simply by forming the BIC cell on the contact area of the MOS transistor 3. As shown in FIG. 3B, when programming this cell array, a normal gate voltage is applied to a word line WL and a programming power supply potential Vp is applied to a bit line BL, whereby the BIC cell is brought to a connected state. On the other hand, in an unselected PROM cell, the BIC cell remains disconnected, since the MOS transistor (cell transistor) 3 is switched OFF, and the $N^+$-diffusion layer of the BIC cell or the drain in the MOS transistor 3 is transitionally reverse-biased when a programming pulse is supplied to the bit line BL. Therefore, a depletion layer is formed under the $N^+$-diffusion layer of the BIC cell, and thus the programming pulse voltage is divided between the BIC insulator and the depletion layer. As a result, the effective bias applied to the BIC cell is lower than the breakdown voltage, and therefore, an unselected PROM cell cannot be programmed.

The preferred embodiments of the present invention will be explained with reference to the drawings.

Figure 4:
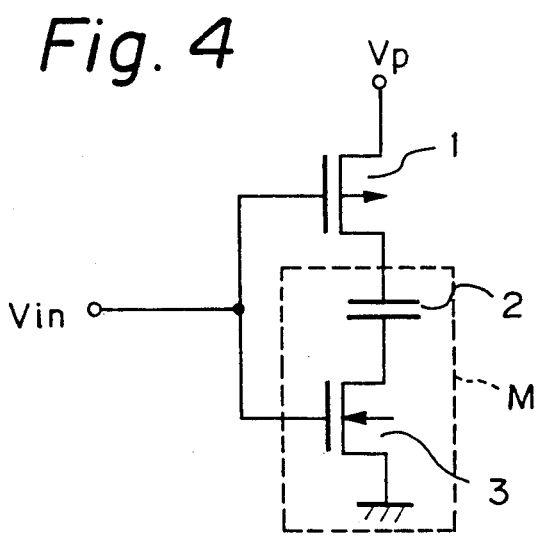
FIG. 4 is a basic diagram of a semiconductor memory circuit according to the present invention.

FIG. 4 is a basic diagram of a semiconductor memory circuit according to the present invention. In FIG. 4, reference numeral 1 denotes a programming transistors, which is a P-channel type MIS transistor, 2 denotes a thin film insulator, 3 denotes a cell transistor, which is an N-channel type MIS transistor. According to the present semiconductor memory circuits as shown in FIG. 4, the insulator 2 is provided between a drain of the programming transistor 1 and a drain of the cell transistor 3. Further, signals Vin supplied to gates of the programming transistor 1 and the cell transistor 3, which correspond to a bit line select signal and a word line select signal, are pulse signals which are in-phase when a programming operation is carried out.

Figure 5:
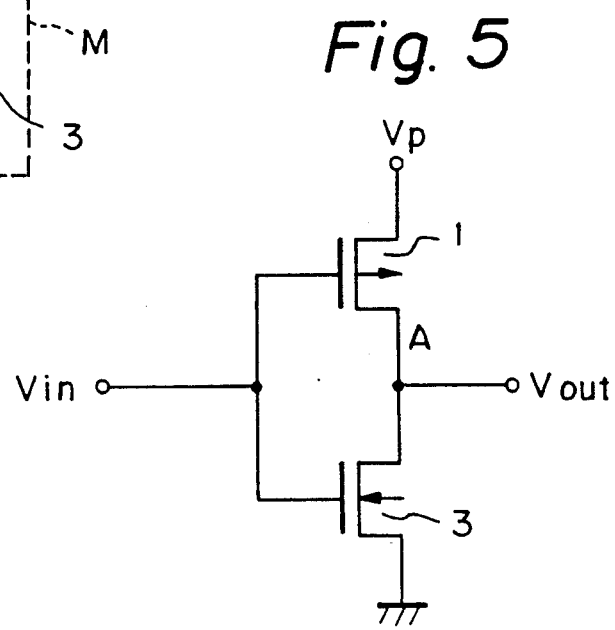
FIG. 5 is a circuit diagram of a CMIS inverter circuit.

FIG. 5 is a circuit diagram showing a CMIS inverter circuit. As shown in FIG. 5, the basic configuration of a semiconductor memory circuit comprising a memory cell (PROM cell) is indicated by a CMIS inverter circuit, and an output voltage of this CMIS inverter circuit is indicated by a reference Vout, which is a potential of a node A.

Figure 6A:
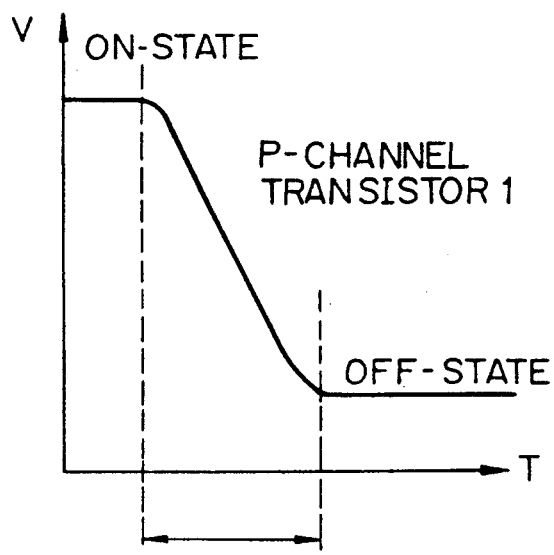
FIGS. 6A and 6B are characteristic diagrams of transistors in the CMIS inverter circuit shown in FIG. 5.
Figure 6B:
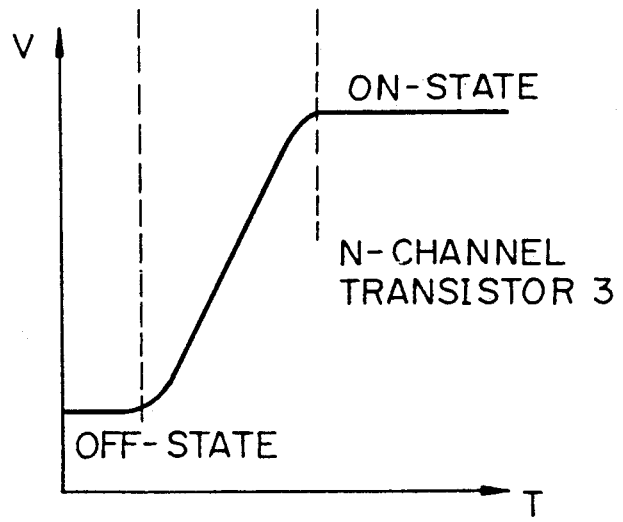

FIGS. 6A and 6B are characteristic diagrams of transistors in the CMIS inverter circuit shown in FIG. 5. As shown in FIG. 6A, in the programming transistor 1, which is a P-channel type MIS transistor, an output potential thereof, which is a drain potential, is changed from a high level to a low level in accordance with a transition characteristic of the transistor 1 when a bit line select signal (Vin) is changed from a low level to a high level. On the other hand, as shown in FIG. 6B, in the cell transistor 3, which is an N-channel type MIS transistor, an output potential thereof, which is a drain potential is changed from a low level to a high level in accordance with a transition characteristic of the transistor 3 when a word line select signal (WL; Vin) is changed from a low level to a high level. Note, both the programming transistor 1 and the cell transistor 3 are switched ON during transition states thereof and a voltage between the output potential of the programming transistor 1 and the output potential of the cell transistor 3 is applied to the insulator 2, and thus an electrical breakdown of the insulator 2 is caused by the application of this voltage between the output potentials of the transistors 1 and 3.

Figure 7:
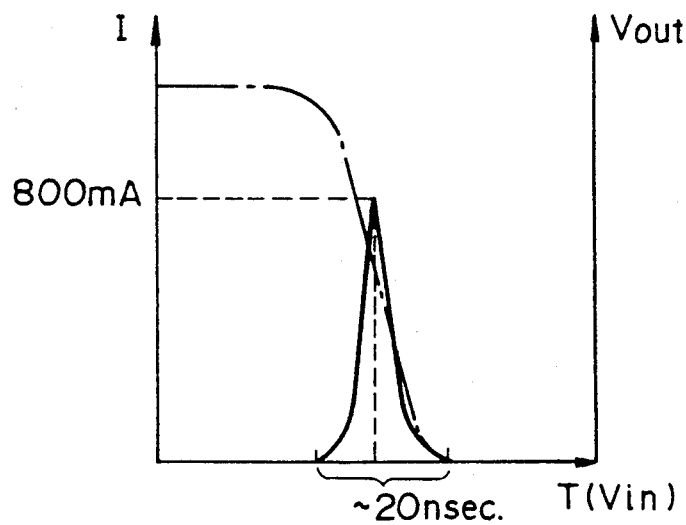
FIG. 7 is an operating characteristic curve of the CMIS inverter circuit shown in FIG. 5.

FIG. 7 shows an operating characteristic curve of the CMIS inverter circuit shown in FIG. 5. As described above, when a bit line select signal and a word line select signal (Vin) are changed from a low level to a high level and are in-phase, a drain potential of the programming transistor 1 is changed from a high level to a low level and a drain potential of the cell transistor 3 is changed from a low level to a high level, in accordance with their transition characteristics, and an output voltage Vout is changed from a high level to a low level as shown by a dot-dash-line in FIG. 7. Note, at this level changing time or transitional time of the transistors 1 and 3, a voltage between a drain potential of the programming transistor 1 and a drain potential of the cell transistor 3, which is determined by their transition characteristics, is applied to the insulator 2, and a current flows through the insulator 2 in a short time as shown by a solid line in FIG. 7, so that an electrical breakdown of the insulator 2 is performed and the BIC cell (insulator) 2 is brought to a connected state. This current flowing through the insulator 2 is determined in accordance with the transition characteristics of the programming transistor 1 and the cell transistor 3, and the configuration of the insulator 2. For example, a maximum level of the current flow at the insulator 2 is 800 milliampere, and a flow time thereof is about 20 nano-seconds (n sec.). consequently, in the present semiconductor memory circuit as described above, both the programming transistor 1 and the cell transistor 3 can be switched ON transiently while the programming transistor 1 is switched OFF and the cell transistor of an N-channel type MIS transistor 3 is switched ON, and a voltage between a drain potential of the programming transistor 1 and a drain potential of the cell transistor 3 is transiently applied to both sides of the insulator 2 as shown in FIG. 7, so that an insulation of the insulator 2 is electrically broken. At this time, the current flowing through the insulator 2 is immediately cut off, and thus a programming process can be performed with a low power consumption and in a short time.

In the above description, a programming process of a memory cell, which is carried out by an electrical breakdown of the insulator 2, can be also performed when the bit line select signal and the word line select signal (Vin) are changed from a high level to a low level and are in-phase. Namely, during the period when the programming transistor 1 is switched ON and the cell transistor 3, is switched OFF, a transient state occurs wherein both transistors 1 and 3 remain switched ON. Therefore, a voltage between a drain potential of the programming transistor 1 and a drain potential of the cell transistor 3 is applied to the insulator 2, and an electrical breakdown of the insulator 2 is performed in the same way as when the signal Vin is changed from a low level to a high level as shown in FIGS. 6A, 6B and 7. Note, a programming process can be performed both at the time of a leading transition and a trailing transition of the pulse signals of the bit line select signal and the word line select signal.

Figure 8:
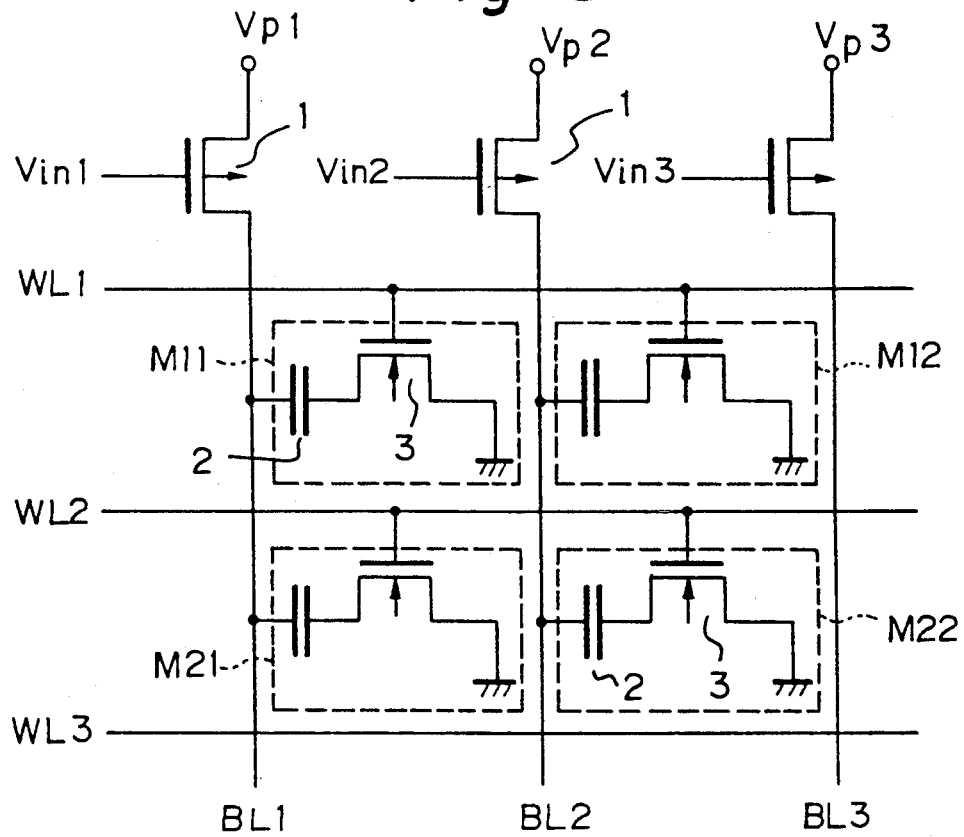
FIG. 8 is a circuit diagram showing an embodiment of a PROM cell array according to the present invention.

FIG. 8 is a circuit diagram showing an embodiment of a PROM cell array according to the present invention. In FIG. 8, references BL1-BL3 denote bit lines, WL1-WL3 denote word lines, and M11-M22 denote memory cells of the PROM cell array.

Each memory cell M11-M22 is provided at an intersection between bit lines BL1, BL2 and word lines WL1, WL2, respectively, and comprises an insulator 2 and cell transistor 3. For example, in the memory cell M11, a gate of the transistor 3 is connected to the word line WL1, a source of the transistor 3 is connected to an earth, and a drain of the transistor 3 is connected to the bit line BL1 through the insulator 2. The bit line BL1 is connected to a source of a programming transistor 1, a gate of the transistor 1 is supplied with a bit line selecting signal Vin, and a drain of the transistor 1 is supplied with a programming power supply potential Vp1, which is an extremely high potential, e.g., 18 volts, for programming the PROM cell. Similarly, in the memory cell M22, a gate of the transistor 3 is connected to the word line WL2, a source of the transistor 3 is connected to an earth, and a drain of the transistor 3 is connected to the bit line BL2 through the insulator 2. The bit line BL2 is connected to a source of a programming transistor 1, a gate of the transistor 1 is supplied with a bit line selecting signal Vin, and a drain of the transistor 1 is supplied with a programming power supply potential Vp2, which is an extremely high potential, e.g., 18 volts, for programming the PROM cell. Note, the word line WL1 and WL2 are supplied with word line selecting signals.

Figure 9:
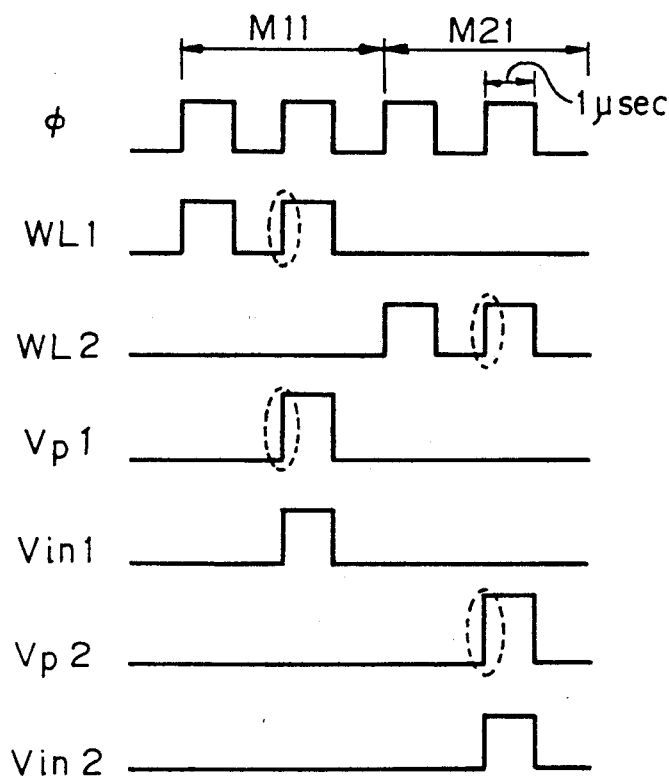
FIG. 9 is a timing chart showing one example of signals of the PROM cell array shown in FIG. 8.

Below, an example of programming the PROM cells M11 and M22 is explained with reference to FIGS. 8 and 9. FIG. 9 is a timing chart showing one example of signals of the PROM cell array shown in FIG. 8, and reference $\phi$ denotes a clock signal having a pulse width of 1 $\mu$sec.

First, a word line select signal (WL1) supplied to a gate of a cell transistor 3 in a memory cell M11 is brought to a high level, e.g., 5 volts by a pulse width of 1 $\mu$sec. when a bit line select signal Vin1 supplied to a gate of a programming transistor 1 and a programming power supply potential Vp1 are maintained at a low level whereby the memory cells M11 and M12 are cleared. Next, after a time of 1 $\mu$sec. of the pulse width, the word line select signal (WL1) is changed from the high level to a low level, and thus the cell transistor 3 is switched OFF. Further, the word line select signal (WL1) is changed from the low level to the high level when the bit line select signal Vin1 and the programming power supply potential Vp1 are changed from the low level to a high level in synchronization with the bit line select signal Vin1, and the programming process of the memory cell M11 is performed. Namely, as described above with reference to FIGS. 4 to 7, when the bit line select signal Vin1 and the word line select signal (WL1) are changed from a low level to a high level and are in-phase, the programming transistor 1 is switched ON and the cell transistor 3 is switched OFF. Note, during the period in which the programming transistor 1 is switched ON and the cell transistor 3 is switched OFF, a transient state occurs wherein both the programming transistor 1 and the cell transistor 3 remain switched ON. Therefore, when a drain potential of the programming transistor 1 is changed from a high level to a low level and a drain potential of the cell transistor 3 is changed from a low level to a high level, in accordance with their transition characteristics, a voltage between the drain potential of the programming transistor 1 and the drain potential of the cell transistor 3 is applied to the insulator 2, so that an electrical breakdown of the insulator 2 is performed.

Similarly, a word line select signal (WL2) supplied to a gate of a cell transistor 3 in a memory cell M22 is brought to a high level when a bit line select signal Vin2 supplied to a gate of a programming transistor 1 and a programming power supply potential Vp2 are maintained at a low level, and the memory cells M21 and M22 are cleared. Next, the word line select signal (WL2) is changed from the high level to a low level, and thus the cell transistor 3 is switched OFF. Further, the word line select signal (WL2) is changed from the low level to the high level, and when the bit line select signal Vin2 and the programming power supply potential Vp2 are changed from the low levels to high level in synchronization with the bit line select signal Vin2, the programming process of the memory cell M22 is performed in the same way as for the programming of the memory cell M11. As described above, a similar operation is carried out at selected cells successively, and the required data is programmed.

In a read out operation, which is the same as a conventional operation, a drive voltage is applied to a bit line BL1-BL3 and a pulse signal is input to a word line WL1-WL3, and a read out potential is generated between both sides of the insulator 2 when the insulation of the insulator 2 is not broken, and thus a high level signal is output therefrom. On the other hand, a read out potential is not generated between both sides of the insulator 2 when the insulation of the insulator 2 is broken, and thus a low level signal is output therefrom. Accordingly, information can be read from each cell described above.

In the above description, both the programming transistor 1 and cell transistor 3 remain switched ON while these transistors 1 and 3 are switched by the transition characteristics thereof, and a high voltage is applied to both sides of the insulator 2, so that the insulation of the insulator 2 is broken and both sides of the insulator 2 are electrically connected. Note, a current flowing through the connected insulator 2 is immediately cut off as shown in FIG. 7, and thus the power consumption during a programming time can be remarkably lowered, and a deterioration of a transistor caused by heat generated in the prior semiconductor memory circuit at the programming time can be avoided. Furthermore, the current flowing in the insulator 2 is cut off when the programming is completed, and thus a high speed programming can be realized whereby the programming time can be shortened.

In this embodiment, the programming power supply potential is synchronized with the bit line select signal, since if the programming power supply potential is maintained at a high level (for example, 18 volts), all memory cells connected to the word line are programmed when the word line select signal is changed to a high level to clear the memory cells. However, if the memory cells are not cleared by changing the level of the word line select signal, i.e., the level of the word line select signal is not changed when the bit line select signal is maintained at a low level, the programming power supply potential need not be changed in-phase with the bit line select signal. Furthermore, where the programming transistor is formed by an N-channel type MIS transistor and the cell transistor is formed by a P-channel type transistor, the programming power supply potential need not be synchronized with the bit line select signal.

Figure 10:
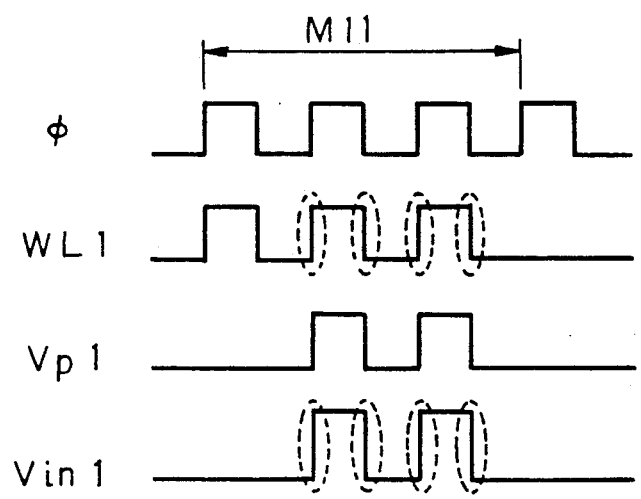
FIG. 10 is a timing chart showing another example of signals of the PROM cell array shown in FIG. 8.

FIG. 10 is a timing chart showing other examples of signals of the PROM cell array shown in FIG. 8. As described above, a programming process of a memory cell, which is carried out by an electrical breakdown of the insulator 2, is performed at both the time of a leading transition and a trailing transition of the pulse signals of the bit line select signal and the word line select signal. In this embodiment of FIG. 10, the pulse signals of the bit line select signal Vin1 and the programming power supply potential Vp1 have two pulses, for programming by a leading transition and a trailing transition of each pulse, i.e., the programming process of the memory cell M11 is performed four times, i.e., at a leading transition of a first pulse in the bit line select signal Vin1, at a trailing transition of the first pulse, at a leading transition of a second pulse, and at a trailing transition of the second pulse.

As described above, the semiconductor memory circuit according to the present invention comprises a plurality of memory cells and a plurality of programming transistors, each memory cell being provided at the intersections between one bit line and one word line. The memory cell includes an insulator and a cell transistor, and a conductivity type of the cell transistor selected by a word line select signal is opposite to that of the programming transistor selected by a bit line select signal. The memory cell is programmed by utilizing an electrical breakdown of the insulator when the bit line select signal and the word line select signal applied are in-phase and both the programming transistor and the cell transistor are switched. Therefore, the memory cell is programmed in a short time during which the programming transistor and the cell transistor are switched, and thus this semiconductor memory circuit can be programmed with a low consumption power and at a high speed.

Many widely different embodiments of the present invention may be constructed without departing from the spirit and scope of the present invention, and it is understood that the present invention is not limited to the specific embodiments described in this specification, except as defined in the appended claims.

I claim:

1. A semiconductor memory circuit, comprising:
   a plurality of word lines, each receiving a word line select signal;
   a plurality of bit lines;
   a plurality of memory cells, each comprising an insulator and a first conductivity type cell transistor, and provided at an intersection of one bit line of said plurality of bit lines and one word line of said plurality of word lines, each of said memory cells being programmed by utilizing an electrical breakdown of said insulator, said cell transistor including a drain connected to said bit line through said insulator, a gate connected to said word line, and a source connected to a first power supply; and
   a plurality of programming transistors of a second conductivity type opposite to said first conductivity type of said cell transistors, and each including a drain connected to one of said bit lines, a gate supplied with a bit line select signal and a source connected to a second power supply, and said bit line select signal and said word line select signal including in-phase pulse signals, such that a current pulse, having a pulse width shorter than that of said in-phase pules signals of said bit line select signal and said word line select signal, is applied to said insulator in said memory cell when a programming operation is carried out.

2. A semiconductor memory circuit according to claim 1, wherein said insulator is electrically broken by a high voltage potential applied both sides thereof, when the in-phase pulse signal of said bit line select signal and said word line select signal are supplied and both said programming transistor and said cell transistor are switched.

3. A semiconductor memory circuit according to claim 1, wherein said second power supply outputs a pulse signal synchronized with said bit line select signal.

4. A semiconductor memory circuit according to claim 1, wherein said cell transistor is an N-channel types MIS transistor, and said programming transistor is a P-channel type MIS transistor.

5. A semiconductor memory circuit according to claim 1, wherein said cell transistor is a P-channel type MIS transistor, and said programming transistor is an N-channel type MIS transistor.

6. A semiconductor memory circuit according to claim 1, wherein said electrical breakdown of said insulator is performed at the time of a leading transition of each pulse in said bit line select signal and said word line select signal and a trailing transition of each pulse in said bit line select signal and said word line select signal.

7. A semiconductor memory circuit according to claim 1, wherein said word line select signal includes a first pulse and a second pulse, said first pulse being for clearing said memory cells and said second pulse being synchronized with said bit line select signal for switching both said programming transistor and said cell transistor.

8. A semiconductor memory circuit according to claim 1, wherein said word line select signal includes a first pulse and programming pulses, said first pulse being used for clearing said memory cells and said programming pulses being synchronized with said bit line select signal for switching both said programming transistor and said cell transistor.

9. A semiconductor memory circuit according to claim 1, wherein said insulator comprises a thin insulator film formed between a signal conductor of said bit line and a contact area of said drain in said programming transistor.

10. A semiconductor memory circuit according to claim 1, wherein the gate of said cell transistor is formed by a signal conductor of said word line.

* * * * *